United States Patent [19]

Reidinger et al.

[11] Patent Number: 4,915,222

[45] Date of Patent: Apr. 10, 1990

[54] ELECTROMAGNETICALLY AND ELECTROSTATICALLY PROTECTED SEE-THROUGH PACKAGING UNIT FOR PRINTED CIRCUIT BOARDS

[75] Inventors: Deborah L. Reidinger, El Toro; Michael S. Freitas, Irvine, both of Calif.

[73] Assignees: Unisys Corporation, Blue Bell, Pa.; Conceptual Design Industries, Irvine, Calif.

[21] Appl. No.: 226,916

[22] Filed: Aug. 1, 1988

[51] Int. Cl.$^4$ .............................................. B65D 73/02
[52] U.S. Cl. .................................... 206/328; 206/334; 206/523
[58] Field of Search ............. 206/328, 589, 590, 591, 206/523, 521, 334; 387/87

[56] References Cited

U.S. PATENT DOCUMENTS

| 1,914,866 | 6/1933 | Rodgers | 206/521 |
|---|---|---|---|
| 2,709,467 | 5/1955 | Hoeppner | 383/87 |
| 3,192,680 | 7/1965 | Mantell et al. | 206/591 |
| 3,752,301 | 8/1973 | Bluemel | 206/521 |
| 3,769,741 | 11/1973 | Hessler et al. | 206/523 |
| 4,154,344 | 5/1979 | Yenni, Jr. et al. | 206/328 |
| 4,274,537 | 6/1981 | Cooper | 206/523 |
| 4,424,900 | 1/1984 | Petcavich | 206/328 |
| 4,647,714 | 5/1987 | Goto | 206/328 |
| 4,648,508 | 3/1987 | Neal et al. | 206/328 |
| 4,658,958 | 4/1987 | McNulty et al. | 206/328 |

FOREIGN PATENT DOCUMENTS

| 0944057 | 7/1949 | Fed. Rep. of Germany | 206/521 |
| 1486223 | 3/1964 | Fed. Rep. of Germany | 383/87 |
| 2320700 | 4/1973 | Fed. Rep. of Germany | 206/521 |

Primary Examiner—David T. Fidei
Attorney, Agent, or Firm—Alfred W. Kozak; Nathan Cass; Robert S. Bramson

[57] ABSTRACT

A protective package unit for shipping printed circuit boards provides an outer container into which one or more printed circuit boards can cushionably reside while encompassed in a see-through bag providing protection from electromagnetic radiation and electrostatic discharge.

16 Claims, 8 Drawing Sheets

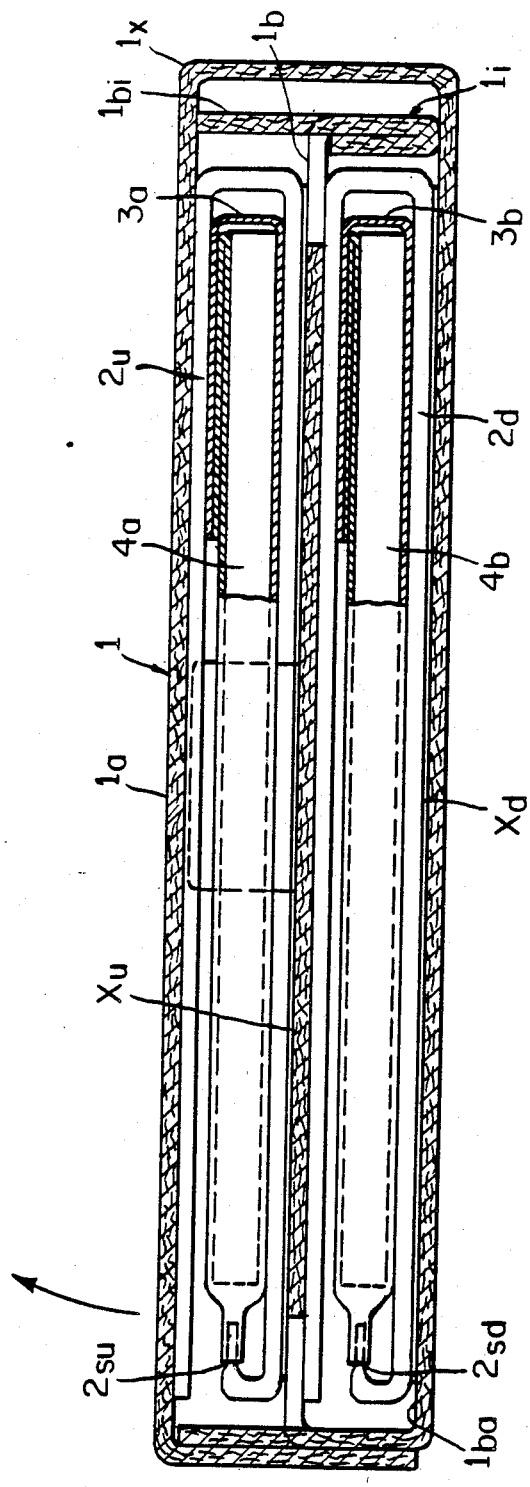

ELECTROMAGNETICALLY AND ELECTROSTATICALLY PROTECTED SEE-THROUGH PACKAGING UNIT FOR PRINTED CIRCUIT BOARDS

FIELD OF THE INVENTION

This disclosure relates to the protective packaging of printed circuit boards suitable for long distance shipping and for ease of visual inspection.

BACKGROUND OF THE INVENTION

With the proliferation in recent years of the use of printed circuit boards for supporting electronic components and precision integrated circuit chips, it has become customary for the printed circuit boards to be shipped long distances for assembly and testing, after which they are transshipped back to the original source for final test and assembly in modules.

The problem arises in regard to providing methods for suitable protection of intensively assembled and highly expensive printed circuit boards while they are undergoing the process of long distance handling and travel in addition to being required to be viewed for customs inspection at various ports of entry and exit.

Considerable problems have arisen in regard not only to mechanical damage due to packing, handling and falling but also damage due to electrostatic discharge and electromagnetic interference which could deteriorate or ruin the quality of the board and its components.

In order to handle this recurrent set of problems which may involve shipments of thousands of packages of printed circuit boards and components, it was considered that some superior and efficient method should be provided not only to protect the shipped and transiting printed circuit boards from mechanical damage and injury but also to protect the boards and their components from the deleterious effects of electrostatic discharge when being handled or inspected by customs agents and also to protect the boards from electromagnetic radiation which could further degrade the boards and the quality of the components inserted thereon.

To this end, there has been developed a packaging procedure and protective wrapping which is designed to obviate and eliminate the types of problems incurred in the transit and handling and inspection and shipping of printed circuit boards.

SUMMARY OF THE INVENTION

The present invention is a protective wrapping packaging unit which is basically built around the container shell and is composed of a corrugated material which constitutes a die-cut box.

Inside the box on the upper and lower wide areas there is provided a cushioning material which has the trade name of CANCEL ® which is laminated adhesively to the corrugated box with a formula known as the "77 formula" via an adhesive manufactured by the 3M Corporation of Minneapolis, Minnesota.

Placed within the container and between the cushioning material is a static shielded plastic bag which is sealed on one side and also laminated to the CANCEL ® material cushion.

The static shielding bag is composed of polyester film which is provided with a metallic layer of 100 angstroms. Additionally, the bag material has a polyethylene film which is anti-static and which has a thickness of approximately 2.3 mils (where one mil is equal to one-thousandth of an inch).

The container can hold up to at least two printed circuit boards which may or may not be of the same size.

A transparent see-through characteristic of the bag material permits any inspecting operation to occur very easily by merely opening up the outside lip of the box container and observing through the transparent material as to the type of printed circuit board inserted therein and any part numbers which may reside on the printed circuit board.

Thus there is no need to unwrap or disassembly the printed circuit board from its protective wrapping and the corrugated container of the box may then be closed and sealed for overall protection. The elimination of the need to unwrap the package thus prevents the destruction of the "Faraday cage" effect provided by the static shielding bag.

BRIEF DESCRIPTION OF PREFERRED EMBODIMENT

Figure 1:
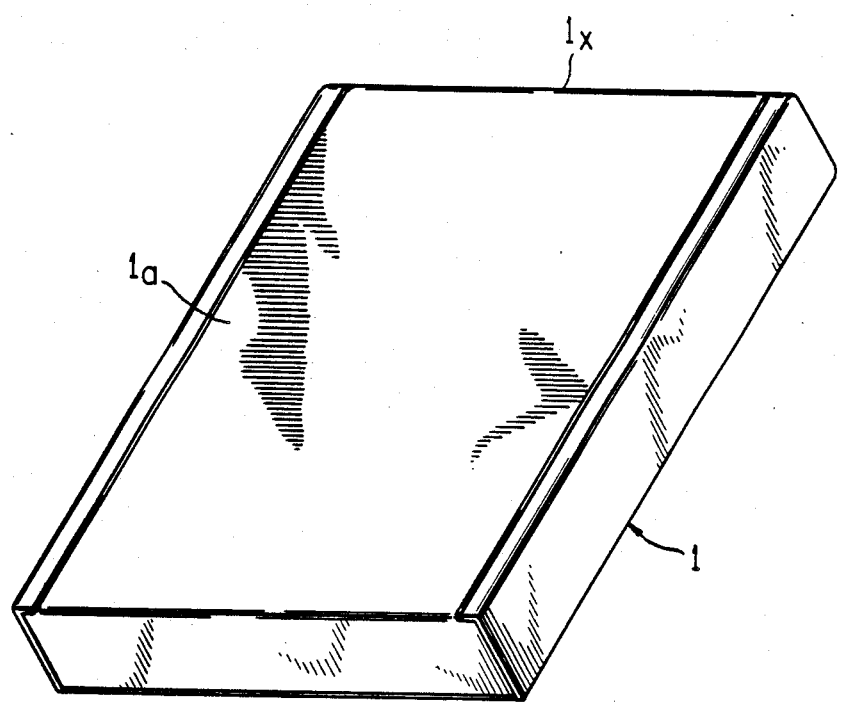
FIG. 1A is an isometric view of the overall box package which contains the protected printed circuit boards.
FIG. 1B is a side cross-sectional view which shows the inner enfoldments of the printed circuit boards in their protective packages.

Referring to FIG. 1, there is seen the basic box configuration which holds the two printed circuit boards therein. This box is generally made of corrugated material and is sometimes referred to as a "roll-in tuck top box".

FIG. 1B shows a cross-sectional side view of the overall protective package for carrying printed circuit boards. The outer box 1 is provided with an upper lid 1a which can be raised in the direction shown by the arrow around the axis line 1x.

The external box 1 can be said basically to be composed of two compartments which can be designated as an upper compartment and a lower compartment.

In the upper compartment there is seen the cushioning material 1u which encompasses the printed circuit board package. The printed circuit board package is seen to be composed of a printed circuit board 4a which is enclosed in an electrostatic discharge—antimagnetic plastic bag designated as 3a. The lower portion of the cushioning material 2u is adhesively laminated (by adhesive Xu) to the top of the inner lid 1b.

In the lower compartment of the overall package 1 there is seen another internal box area having a lid 1b. The internal box is designated 1i.

Within the confines of the lower compartment and the lower internal box 1i there is seen a second printed circuit board 4b which is surrounded by a plastic see-through bag 3b which is antimagnetic and capable of electrostatic discharge to provide protection to the internal printed circuit board from electrostatic voltage discharges and from electromagnetic radiation.

Surrounding the second printed circuit board and its see-through plastic bag 3b there is a cushioning material designated 2d which protectively surrounds the internal printed circuit board and its covering plastic bag. The lower portion of the cushioning material 2d is adhesively laminated to the base area 1ba of the container 1. The adhesive is applied at the lower areas marked Xd in FIG. 1B.

In order to prevent removal or detachment of the shielding see-through bags 3a and 3b, each of these bags is sealed to the respective cushioning material 2u and 2d at sealing joints 2su and 2sd.

Figure 2:
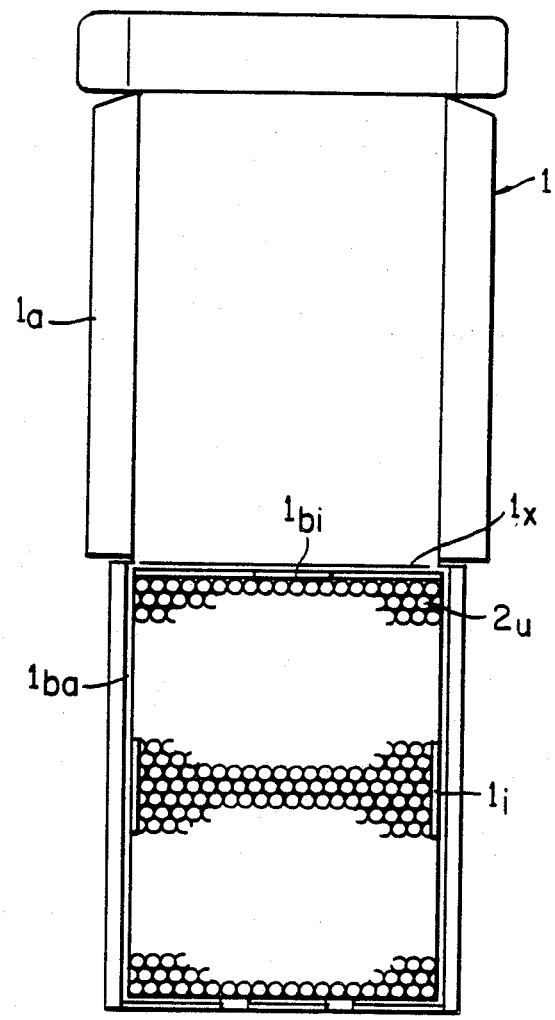
FIG. 2 is a top view drawing of the package when the upper lid is opened up to reveal the first layer of the inside showing the cushioning material.

Referring to FIG. 2, there is seen the condition wherein the external box 1 has its upper lid 1a lifted off the main portion of the box area to reveal the cushioning material 2u. This cushioning material 2u and 2d is a static-free plastic cushioning material which may be of the type such as that having the trade name CANCEL ® as manufactured by ADE Inc., 1430 E. 130th St., Chicago, Illinois 60633.

Figure 3:
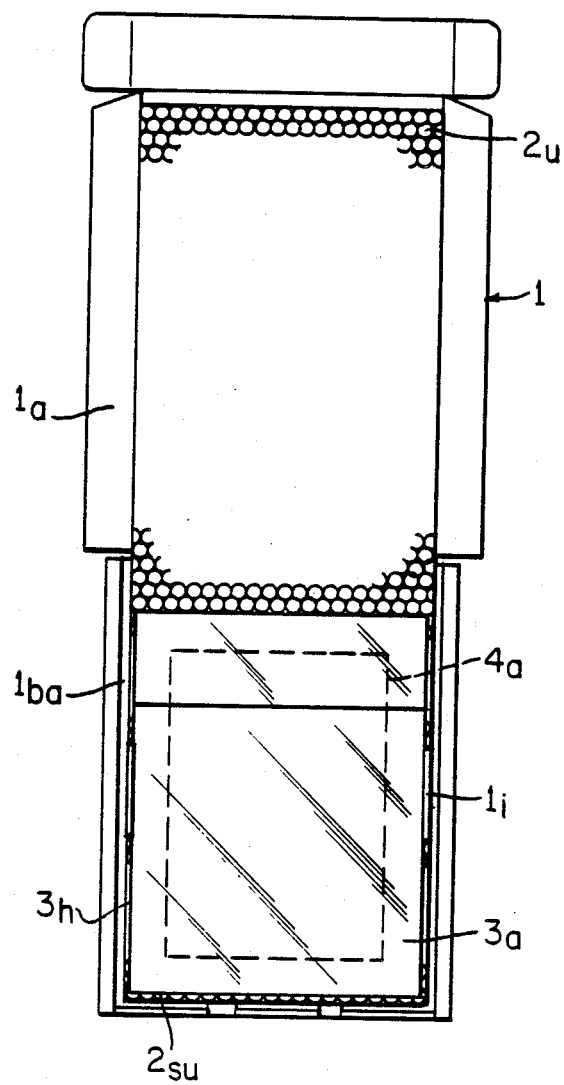
FIG. 3 is a top view showing the first protective layer of see-through plastic bag carrier which contains the first printed circuit board.

Now referring to FIG. 3, there is seen the top view of the opened top lid 1a which has within its inside area the cushioning material 2u. The lower portion of FIG. 3 shows the static shielding bag 3a which contains the first printed circuit board shown in the dotted lines as 4a.

Figure 4:
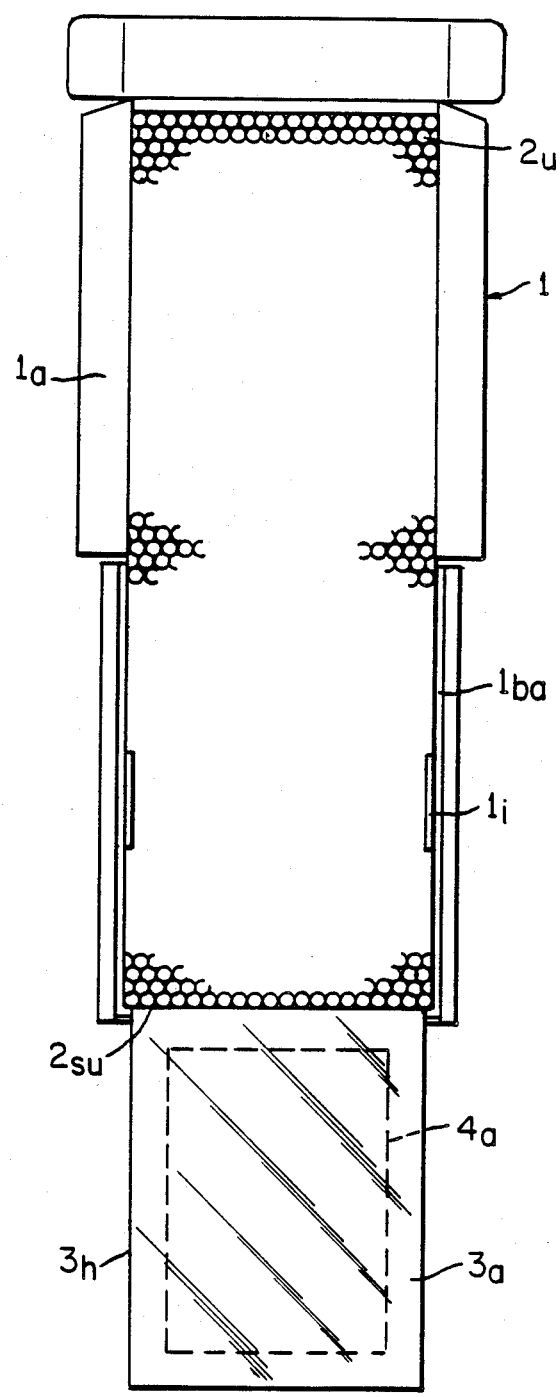
FIG. 4 shows a top plan view when the first protective see-through carrier and its internal printed circuit board is flipped outward from its inside position.

FIG. 4 is a top view illustration showing how the top printed circuit board 4a and its static shielding bag 3a can be flipped outward from the main inside portion of the box 1 in order to provide a quick visual inspection of the printed circuit board 4a by looking directly through the static shielding bag 3a. This outward flip configuration is advantageous also in permitting the insertion of the printed circuit board 4a into the shielding bag 3a.

It will be noted that there is a special heat seal 2su whereby the plastic cushioning designated as 2u is sealed to the inside of the static shielding bag 3a which holds the first or upper printed circuit board 4a. Additionally, one side of the static shielding bag 3a is heat sealed for added protection at area 3h of FIG. 4.

Figure 5:
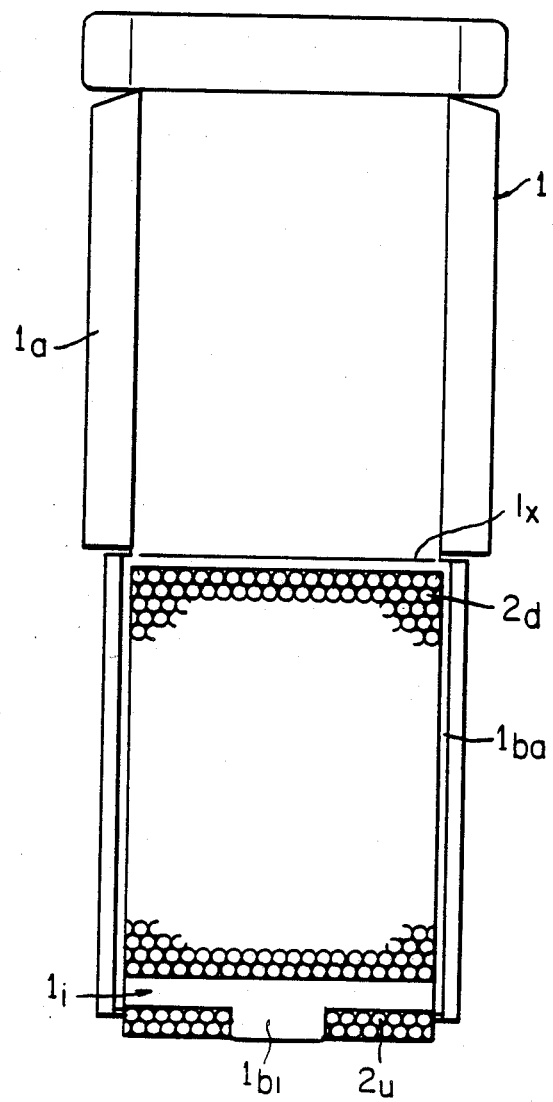
FIG. 5 is a top plan view showing the situation where the printed circuit boards are kept internally and covered with a protective cover of cushioning material.

FIG. 5 illustrates how the first printed circuit board and its see-through static shielding bag 3a can be flipped back into the main central portion of the box and then covered by the cushioning material 2u.

FIG. 6 again illustrates how the upper lid 1a and the upper compartment portion of the overall package can be flipped out together with the flip-out of the upper printed circuit board 4a and its shielding bag 3a. Then, by raising and flipping out the inner lid 1i, it is seen that the inner top lid 1i is shown in the lower portion of the drawing and the dotted lines indicate that the printed circuit board 4a is encompassed by the static shielding bag 3a lying underneath the inner lid 1i. The tab 1bi is provided for handling of the inner lid 1i.

In the central portion, the container box 1 reveals the opened lower compartment in which the second printed circuit board 4b is encompassed by the see-through protective static shielding bag 3b.

Figure 6:
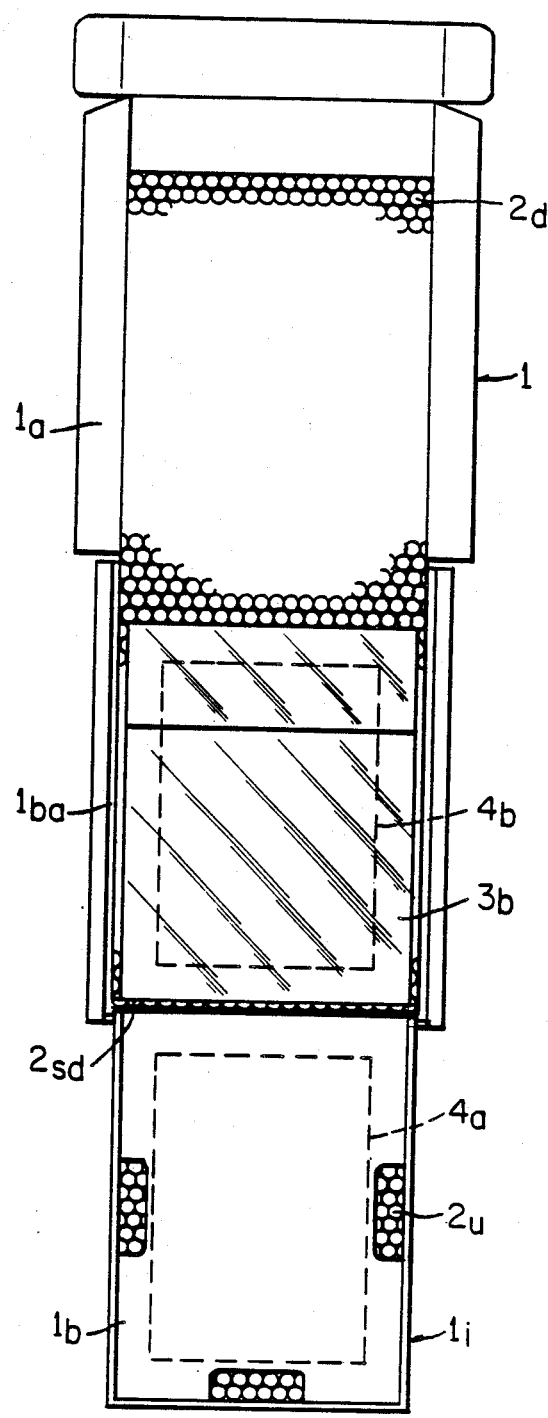
FIG. 6 is a top plan view showing how the first protective plastic see-through carrier bag and its internal printed circuit board is flipped outward in order to reveal the second internal box under which there resides the second printed circuit board surrounded by its plastic see-through bag protective carrier.

The upper portion of the drawing of FIG. 6 indicates the cushioning material which is antistatic and designated as 2u which resides in this condition upon the upper lid 1a.

Figure 7:
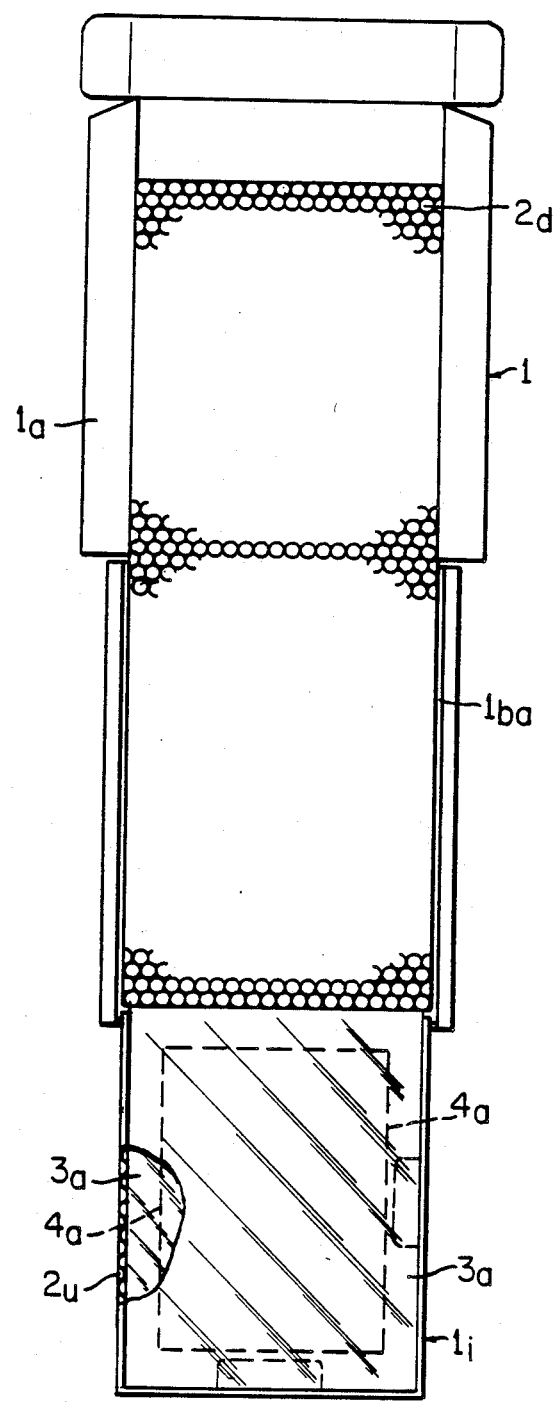
FIG. 7 is a top plan view showing both the first and second plastic carriers and their respective printed circuit boards being flipped outward to reveal the bottom of the main box having the cushioning material lying inside.

FIG. 7 illustrates the situation whereby the inner box lid 1i has been opened and flipped out and the second printed circuit board has been flipped out to expose the second level of the compartment which holds the second printed circuit board 4b which is encompassed by the shielding bag 3b.

As indicated by the dotted lines labeled 4a and 3a, there is seen the pieces of the hidden underside which contain the printed circuit board 4a which is encompassed by the plastic shielding bag 3a.

The central section of the main box is seen with the bottom level corrugated cushioning material designated as 2d while the upper portion of the drawing shows the top lid 1a also having the cushioning material on the underside of the top lid.

As a result of the FIGS. 2–7 which indicate the various configurations when the outer and inner box are opened to flip out the printed circuit boards, it may now be more understandable to look again at FIG. 1B which illustrates the cross-sectional view showing how the upper lid may be raised, after which the upper compartment may be flipped outward to indicate how the printed circuit board is encompassed by the see-through shielding bag which is also cushioned by the cushioning material 2u.

Likewise in FIG. 1B, the inner box lid 1i may also be flipped outward over on top of the upper compartment in order to reveal that the printed circuit board 4b is encompassed by the see-through plastic shielding material 3b and the entire protective package over printed circuit board 4b is covered by the cushioning material 2d.

Thus there has been provided a protective package unit for holding printed circuit boards whereby the printed circuit boards are protected against the hazards of long distance shipping and handling. At the same time, the package may be easily opened and presented to view for customs inspection or other inspection whereby the inspector can see clearly through the shielding bags and observe the condition of the printed circuit boards residing therein.

In regard to the components involved in this combination, the roll-in tuck top box may be of that type of box which is typically manufactured by Aggressive Container Company of 1355 West Imperial Blvd. in Brea, California.

The cushioning material is that typically of the type provided by ADE Incorporated of 1430 East 130th Street, Chicago, Illinois 60633. One preferred type of such cushioning material is designated as CANCEL ® static-free cushioning material as manufactured by ADE, Inc. and designated PPP-C-1842, Type III. The CANCEL ® cushioning material is a registered trademark of the ADE, Inc. and is described in a brochure referenced as CANCEL ® Static-Free Cushioning Material PPP-C-1842, Type III.

The static shielding bag which provides electrostatic discharge protection and also electromagnetic protection may be of the type manufactured by the Dunmore Company of Newtown Industrial Commons, Pennstrail of Newtown, Pennsylvania 18940.

The overall assembly and manufacture of these components into one compact packaging box is typical of that done by Conceptual Design Industries of 17841 Mitchell Avenue in Irving, California 92714.

Not only will the protective packaging box container have the capability to contain at least two printed circuit boards, it also makes it possible to open the box very simply and easily and then to identify the product without jeopardizing the "Faraday cage" effect which protects the printed circuit board and its components from deterioration or static discharge. Additionally, because of the see-through capability of the static bag which encompasses the printed circuit board, it is possible to read the part numbers and inspect the inside contents without breaking the seal of the bag or subjecting the printed circuit board to electrostatic or electromagnetic charges.

Additionally, with the present concept there is a requirement for only one size overall package and one size of internal static bag pouches for static shielding which can be used for many different sizes of printed circuit boards. There is no longer any need to require different size boxes and different size static shielding bags in order to accommodate different sizes of printed circuit boards.

It may be noted that the overall box package has an upper compartment and a lower compartment in which there is a secondary interior box area. These box areas are hinged so that the top lid opens in one direction in order to expose the internal printed circuit board packages, and the internal box lid opens in the opposite direction which permits the first and second printed circuit boards and their protective packages to be flipped outward in the direction opposite from the direction of opening of the top lid of the overall package. Thus a quick and easy method is provided, without destroying the packaging coherence, which permits an inspector to quickly look at and inspect the contents of each of the protective shielding bags without destroying or opening up the protective shielding bags and thus possibly damaging the printed circuit board and its components. Likewise, the unitary feature of the package unit holds together all of the components so that there is no inadvertent separation or detachment of the parts which constitute the entire containment package.

While other similar variations of this unique and efficient packaging combination may be devised, it should be understood that this configuration is defined by the following claims which may encompass a variety of configurations.

What is claimed is:

1. A physically protective container having capability for holding one or more printed circuit boards comprising, in combination:
    (a) movable lid means for opening said protective container;
    (b) a transparent anti-electrostatic anti-electromagnetic primary plastic bag having capability of encompassing a first said printed circuit board wherein said plastic bag provides protection from electrostatic discharges and from electromagnetic radiation when a printed circuit board is located therein; and
    (c) cushioning means fixedly attached to the interior of said container, for encompassing said transparent primary plastic bag;
    (d) said protective container including:
    (d1) an upper compartment having capability for holding said first printed circuit board encompassed by said primary plastic bag and cushioning means; and
    (d2) a lower compartment, having an internal protective lid, for holding a second printed circuit board encompassed by an auxiliary one of said anti-electrostatic anti-electromagnetic plastic bags and an auxiliary layer of said cushioning means said auxiliary plastic bag being fixedly sealed at one end to said cushioning means;
    (d3) said first printed circuit board being located in said primary plastic bag; and
    (d4) said second printed circuit board being located in said auxiliary plastic bag.

2. The container of claim 1 wherein said transparent plastic primary bag encompassing said first printed circuit board is fixedly sealed at one end to said cushioning material thus permitting it to be flipped outward without separation from said container, and allowing for visibility on either side thereof.

3. The container of claim 1 wherein said transparent plastic primary bag encompassing said first printed circuit board is fixedly sealed at one end to said cushioning material permitting it to be flipped outward to expose said lower compartment whereby said auxiliary encompassing plastic bag and said second printed circuit board may then be flipped outward for visual inspection of both sides of said second printed board without removal of the said second board from said auxiliary anti-electrostatic anti-electromagnetic plastic bag.

4. A transportable packaging unit for protective handling of electrically and magnetically sensitive printed circuit boards comprising in combination:
    (a) outer box container means having a lid for opening into the contents thereof, said container means including:
    (a1) an upper compartment for holding a first printed circuit board wrapped in an anti-electrostatic, anti-electromagnetic see-through plastic bag; and
    (a2) a lower compartment for holding a second printed circuit board wrapped in an anti-electrostatic, anti-electromagnetic see-through plastic bag;
    (a3) wherein said upper compartment and said lower compartment are lined with cushioning means.

5. The unit of claim 4 wherein said cushioning means is made of CANCEL ® anti-static plastic liner.

6. The unit of claim 1 wherein each of said primary and said auxiliary anti-electrostatic, anti-electromagnetic see-through plastic bag is made of layers of polyester and polyethylene film having a metallic layer therebetween.

7. The packaging unit of claim 4 wherein said outer box container means is made of corrugated paper of the "roll-in tuck top" format.

8. The packaging unit of claim 1 wherein said upper compartment has an outer lid which can be opened to permit said primary plastic bag and its first printed circuit board to be flipped outward for inspection without removal of said primary plastic bag.

9. The packaging unit of claim 1 wherein said lower compartment which includes said internal lid, permits outward flipping of said internal lid thus permitting said auxiliary plastic bag and said second printed circuit board to be flipped outward for visual inspection of both sides of said second printed circuit board.

10. The packaging unit of claim 1 wherein said upper compartment may be opened to flip out for inspection said primary plastic bag and first printed circuit board; after which said lower compartment may be opened to flip out for inspection said auxiliary plastic bag and said second printed circuit board.

11. A transportable and protective packaging unit for holding one or more printed circuit boards comprising in combination:
  (a) outer container means for physical protection;
  (b) inner means for holding a printed circuit board said inner means including:
    (b1) an anti-electrostatic, anti-electromagnetic see-through sealed plastic wrapper for encompassing said printed circuit board;
    (b2) cushioning means encompassing said see-through plastic wrapper;
  (c) means for opening said outer container means;
  (d) means for permitting the flipping out of said sealed see-through plastic wrapper and printed circuit board without detaching said plastic wrapper from said inner means, and without breaking the sealed condition of said plastic wrapper during inspection of either side of said printed circuit board.

12. A protective shipping package unit for transporting sensitive electronic components, comprising, in combination:
  (a) containing means for encompassing and protectively covering an electronic component located therein;
  (b) a transparent see-through plastic bag attached at one end to the inside of said containing means, said plastic bag including a thin covering of metallic material which constitutes a Faraday cage for shielding said electronic component placed within from electrostatic and electromagnetic influences;
  (c) wherein said electronic component constitutes a printed circuit board populated with integrated circuits.

13. The package unit of claim 12 wherein said plastic bag is sufficiently transparent in ordinary light to enable an observer to identify the contents of said electronic component in said plastic bag, including any part numbers or other identifying marks residing thereon.

14. A transportable package unit for holding electrically and magnetically sensitive electronic components comprising, in combination:
  (a) corrugated box container means providing an inner protective chamber;
  (b) shielding container means fixedly attached to said box container means at one end, said container means including:
    (b1) a flexible see-through film forming a bag for encompassing said electronic components, said film having a thin metallic coating to form a Faraday cage around said electronic components;
    (b2) an opening slit at one end of said bag for insertion and removal of said electronic components;
    (b3) means for preventing said electronic components in said bag from slipping out inadvertently; and
  (c) cushioning means placed between said box container means and said shield container means.

15. The package unit of claim 14 wherein said electronic component include:
  (a) a printed circuit board for holding integrated circuits.

16. The package unit of claim 14 wherein said means for preventing slipping out includes:
  (a) a creased and fold-over portion of said flexible film near the end toward said opening slit.

* * * * *